United States Patent
Cabral, Jr. et al.

(10) Patent No.: US 6,503,641 B2
(45) Date of Patent: Jan. 7, 2003

(54) INTERCONNECTS WITH TI-CONTAINING LINERS

(75) Inventors: Cyril Cabral, Jr., Ossining, NY (US); Roy Arthur Carruthers, Stormville, NY (US); James McKell Edwin Harper, Yorktown Heights, NY (US); Chao-Kun Hu, Somers, NY (US); Kim Yang Lee, Fremont, CA (US); Ismail Cevdet Noyan, Yorktown Heights, NY (US); Robert Rosenberg, Cortlandt Manor, NY (US); Thomas McCarroll Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 09/740,089

(22) Filed: Dec. 18, 2000

(65) Prior Publication Data

US 2002/0076574 A1 Jun. 20, 2002

(51) Int. Cl.$^7$ ............................. B32B 15/01; H01B 5/00
(52) U.S. Cl. .................... 428/661; 174/126.2; 257/751; 428/636; 428/651; 428/662; 428/663; 428/664; 428/665; 428/674; 428/929; 428/935; 428/936; 428/938

(58) Field of Search ................................. 428/661, 651, 428/662, 663, 664, 665, 636, 674, 929, 935, 936, 938; 174/126.2; 257/751

(56) References Cited

U.S. PATENT DOCUMENTS

| 4,673,623 A | * | 6/1987 | Gardner et al. ............. 428/651 |
| 5,889,328 A | * | 3/1999 | Joshi et al. ................. 257/751 |

* cited by examiner

Primary Examiner—Robert R. Koehler
(74) Attorney, Agent, or Firm—Robert M. Trepp; Randy W. Tung

(57) ABSTRACT

An electrical conductor for use in an electronic structure is disclosed which includes a conductor body that is formed of an alloy including between about 0.001 atomic % and about 2 atomic % of an element selected from the group consisting of Ti, Zr, In, Sn and Hf; and a liner abutting the conductor body which is formed of an alloy that includes Ta, W, Ti, Nb and V. The invention further discloses a liner for use in a semiconductor interconnect that is formed of a material selected from the group consisting of Ti, Hf, In, Sn, Zr and alloys thereof, $TiCu_3$, $Ta_{1-x}Ti_x$, $Ta_{1-x}$, $Hf_x$, $Ta_{1-x}In_{xy}$, $Ta_{1-x}Sn_x$, $Ta_{1-x}Zr_x$.

13 Claims, 4 Drawing Sheets

INTERCONNECTS WITH TI-CONTAINING LINERS

FIELD OF THE INVENTION

The present invention generally relates to a method for forming an electrical conductor in an electronic structure and more particularly, relates to a method for forming an electrical conductor that contains up to 2 atomic % of an impurity element surrounded by a liner that contains Ti.

BACKGROUND OF THE INVENTION

The technology of making metal conductors to provide for vias, lines and other recesses in semiconductor chip structures, flat panel displays and package applications has been developed in the past decade. For instance, in developing interconnection technology for very-large-scale-integrated (VLSI) structures, aluminum has been utilized as the primary metal source for contacts and interconnects in semiconductor regions or devices located on a single substrate. Aluminum has been the material of choice because of its low cost, good ohmic contact and high conductivity. However, pure aluminum thin-film conductors have undesirable properties such as a low melting point which limits its use to low temperature processing and possible diffusion into the silicon during annealing which leads to contact and junction failure, and poor electromigration resistance. Consequently, a number of aluminum alloys have been developed which provided advantages over pure aluminum.

Recently developed USLI technology has placed more stringent demands on the requirements due to the extremely high circuit densities and faster operating speeds required of such devices. This leads to higher current densities in increasingly smaller conductor lines. As a result, higher conductance wiring is desired which requires either larger cross-section wires for aluminum alloy conductors or a different wiring material that has a higher conductance. The obvious choice in the industry is to develop the latter which includes pure copper for its desirable high conductivity.

In the formation of ULSI interconnection structures such as vias and lines, copper can be deposited into such recesses to interconnect semiconductor regions or devices located on the same substrate. However, copper is known to have problems in semiconductor devices. The electromigration phenomenon occurs when the superposition of an electric field onto random thermal diffusion in a metallic solid causes a net drift of atoms in the direction of electron flow. Any diffusion of copper atoms into the silicon substrate can cause device failure. In addition, pure copper does not adhere well to oxygen-containing dielectric material such as silicon dioxide and polyimide. To fully utilize copper in interconnection technology, the adhesion properties of copper must also be improved.

The back-end-of-line (BEOL) copper metallurgy further requires liners that are multi-functional, which includes the adhesion to dielectric, the diffusion barrier to the copper, the lowest resistance for contacts and line redundancy, and the reliability of copper. One of the presently used liner technology in the industry is a layered TaN/Ta system for a copper conductor. The TaN layer is required for adhesion and conversion of Ta to the low resistance allotropic alpha phase. The Ta layer provides a diffusion barrier, redundancy and adhesion to copper.

It is therefore an object of the present invention to provide a liner for an electrical conductor in an electronic structure that does not have the drawbacks; or shortcomings of conventional liner materials.

It is another object of present invention to provide a liner for electrical conductors in an electronic structure that provides improved electromigration resistance.

It is a further object of the present invention to provide a liner for electrical conductors in an electronic structure that contains Ti.

It is another further object of the present invention to provide a liner for Cu conductors that has improved reliability and electromigration resistance.

It is still another object of the present invention to provide a liner for a Cu conductor in a semiconductor structure that is compatible with a single damascene or dual damascene process.

It is yet another object of the present invention to provide an electrical conductor in an electronic structure that includes a conductor body formed of an alloy containing up to 2 atomic % of an element selected from Ti, Zr, In, Sn and Hf.

It is still another further object of the present invention to provide a Cu conductor in a semiconductor structure that has an abutting liner formed of a material containing Ta, W, Ti, Nb, and V.

SUMMARY OF THE INVENTION

In accordance with the present invention, a conductor in an electronic structure that includes a conductor body and a liner is disclosed.

In a preferred embodiment, a conductor in an electronic structure is provided which includes a conductor formed of an alloy including between abut 0.001 atomic % and about 2 atomic % of an element selected from the group consisting of Ti, Zr, In, Sn, and Hf, and a liner abutting the conductor body formed of an alloy that includes Ta, W, Ti, Nb and V.

In the conductor formed in an electronic structure, the conductor body may further include Cu or Al. The conductor body may further include Cu and Ti, the liner may further include between about 10 atomic % and about 60 atomic % Ta. The conductor body may further include Al and Ti, or the liner may include between about 10 atomic % and about 90 atomic % of Ti. The liner may further include a bi-layer formed of $Ta_{1-x}N_y$ and $Ta_{1-x}$, respectively. The conductor may further be an interconnect in a single damascene structure, or in a dual damascene structure. The conductor body may further include between about 0.001 atomic % and about 2 atomic % Ti, the liner may further include not less than 20 atomic % Ti.

The present invention is further directed to a liner for a semiconductor interconnect that is formed of a material selected from the group consisting of Ti, Hf, In, Sn, Zr and alloys thereof, $TiCu_3$, $Ta_{1-x}Ti_x$, $Ta_{1-x}Hf_x$, $Ta_{1-x}In_x$, $Ta_{1-x}Sn_x$, $Ta_{1-x}Zr_x$ and mixtures thereof.

In the liner for a semiconductor interconnect, the material for forming the interconnect may be $Ta_{1-x}Ti_x$. When the liner abuts a semiconductor interconnect is formed of Cu or Cu alloy, x=10~60 atomic %. When the liner abuts a semiconductor interconnect is formed of Al or Al alloy, x=10~90 atomic %. The liner may further include a bi-layer structure of $Ta_{1-x}Ti_xN_y$ and $Ta_{1-x}Ti_x$.

The present invention is further directed to a method for forming an electronic structure that can be carried out by the operating steps of first forming an opening in a pre-processed electronic substrate, then depositing into the opening a liner of a material selected from the group consisting of Ti, Hf, In, Sn, Zr and alloys thereof, $TiCu^3$, $Ta_{1-x}Ti_x$, $Ta_{1-x}Hf_x$, $Ta_{1-x}In_x$, $Ta_{1-x}Sn_x$, $Ta_{1-x}Zr_x$ and mixtures thereof, and filling the opening on top of the liner with an alloy includes between about 0.001 atomic % and about 2 atomic % of an element selected from the group consisting of Ti, Zr, Hf, In, and Sn.

The method may further include the step of filling the opening with a Cu alloy or an Al alloy. The method may further include the step of depositing a liner of a bi-layer structure of $Ta_{1-x-y}Ti_x N_y$ and $Ta_{1-x}Ti_x$. The method can be integrated into a single damascene process, or into a dual damascene process. The method may further include the step of filling the opening with an alloy by a method selected from the group consisting of PVD, CVD, electrodeposition and electroless deposition. The method may further include the atep of depositing the liner in $Ta_{1-x}Ti_x$ and annealing the liner at a temperature not higher than 450° C. when x is larger than about 20 atomic %.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1A:
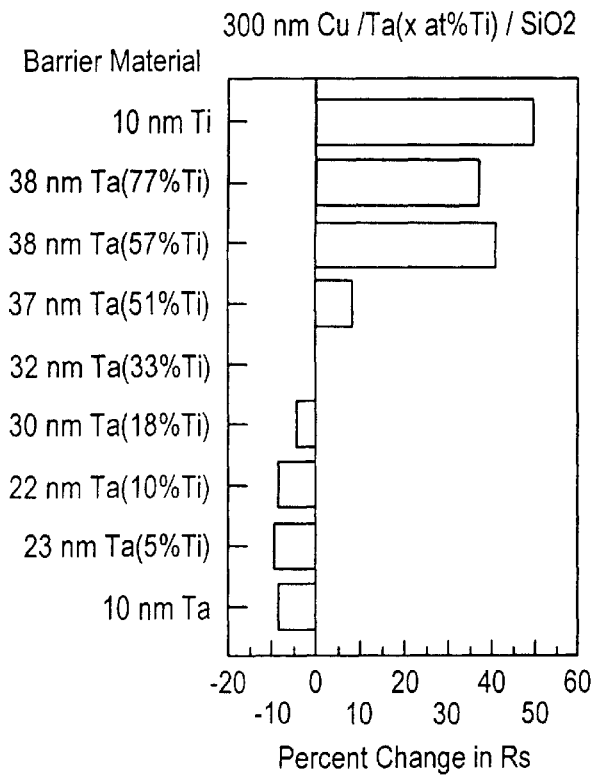
FIG. 1A is a graph illustrating the resistance-temperature relationship with changes in Ti content in the present invention $Ta_{1-x}Ti_x$ liner.

The present invention discloses a conductor formed in an electronic structure and a liner for such conductor in the electronic structure.

The present invention conductor formed in an electronic structure can be provided which includes a conductor body that is formed of an alloy that includes between about 0.001 atomic % and about 2 atomic % of an element selected from the group consisting of Ti, Zr, In, Sn and Hf, and a liner that abuts the conductor body that is formed of an alloy which includes Ta, W, Ti, Nb and V.

The present invention further discloses a liner for a semiconductor interconnect that is formed of a material selected from the group consisting of Ti, Hf, In, Sn, Zr and alloys thereof, $TiCu_3$, $Ta_{1-x}Ti_x$, $Ta_{1-x}Hf_x$, $Ta_{1-x} In_x$, $Ta_{1-x} Sn_x$, $Ta_{1-x} Zr_x$.

The present invention still further discloses a method for forming an electronic structure that can be carried out by the operating steps of first forming an opening in a pre-processed electronic substrate, then depositing into the opening a liner of a material selected from the group consisting of Ti, Hf, In, Sn, Zr, and filling the opening on top of the liner with an alloy that includes between about 0.001 atomic % and about 2 atomic % of an element selected from the group consisting of Ti, Zr, Hf, In and Sn.

It is discovered that within a desirable range of the Ti content, i.e., about 18–40 atomic %, the requirements of adhesion between the dielectric diffusion barrier and the Cu and the low resistance for contact line redundancy are met. Ti was found to stabilize in the alpha phase, while Ta is normally in high resistance beta phase at temperatures lower than 750° C. Ti also provides adhesion to the dielectric and Cu, maintains barrier properties to 650 ° C., and does not increase the resistance of the Cu line by diffusion. It was also found that the resistance increases by annealing when the Ti content exceeds 50 atomic %. These desirable properties are gained in addition to the expected increase in electromigration lifetime. The present invention Ti-containing liner therefore fulfills multi-functions for use in BEOL Cu metallurgy.

The present invention novel method proposes the use of a liner as a single layer liner, thus saving process steps involving the deposition of second or third layer. The present invention novel method further reduces the total liner thickness which would have impacted the resistance or reliability as feature size decreases. The novel process is consistent with normal process temperatures of 400–450° C. and Ta deposition method, such that no additional processing steps need to be incorporated into the BEOL fabrication method.

It is further discovered that electroplated Cu tends to be of high purity as a result of the normal chemical process. Ti appears to be the metal of choice for diffusing into Cu either from below or from above by way of a separate layer or as part of an existing liner. The transition metal of Ti enhances electromigration resistance primarily by plugging up the grain boundaries. As a result, large grain Cu with a transition metal in the grain boundaries slows down grain boundary diffusion.

Impurities within the Cu grains do not appear to affect electromigration resistance unless the impurities diffuse to the grain boundary.

The present invention provides a liner material for circuit metallization that functions as a diffusion barrier to the metal, as an adhesion layer to the metal and to the dielectric, as a supplier of dopant to the metal for diffusing to the interface for enhancing reliability, and as a thinner, lower resistance liner alternative. The present invention enables these attributes which can be utilized for both copper-based and aluminum-based metal interconnects. The resistance of the metal is not degraded.

The present invention uses $Ta_{1-x}Ti_x$ alloy liner to replace conventional liners such as TaN/Ta for Cu, and Ti or Ti/TaN for Al. In the Cu case, Ta is not reactive and is insoluble in Cu and thus does not provide benefits for electromigration lifetime, and thus TaN is needed for adhesion to the dielectric layer. In Al, Ti is reactive and $TiAl_3$ is formed which reduces the Al area and roughens the interface. As the line width is reduced, the thickness of the liner or reactive layer becomes more restrictive for resistance and reliability control. The Ti/TiN layer reduces the reaction, but the total liner is thicker and therefore, more resistive. In the case of a Ti layer for Cu, for example, 10 nm Ti/100 nm Cu, the electromigration resistance is greatly increased. However, the resistance of Cu becomes unacceptably high. Furthermore, the diffusion barrier properties of Ti are inadequate such that a barrier multi-layer with TaN/Ta is required, thus compounding the thickness problem and adding a new process step.

The present invention novel liner structure of $Ta_{1-x}Ti_x$ provides significant property improvements. For instance, by controlling the Ti concentration (x), reaction with the metal and the dielectric can be adjusted to provide adhesion to the dielectric, to retain diffusion barrier characteristics, to retain low resistance in the Cu lines and to provide sufficient Ti to increase the electromigration and thermal stress lifetime. Another added benefit of the Ti addition to Ta is the fabrication of Ta films in the low resistance state, i.e. in the alpha phase at low annealing temperatures.

Figure 1B:
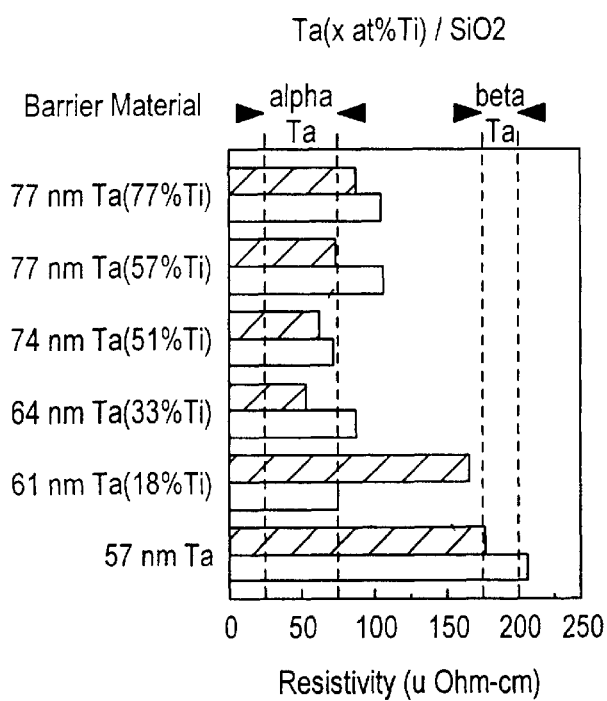
FIG. 1B is a graph illustrating the resistance-temperature relationship with changes in Ti content in a $Ta_{1-x}Ti_x$ liner without copper on top.

Referring initially to FIGS. 1A and 1B wherein the resistance-temperature relationship with changes in Ti content is illustrated. Without Ti addition and annealed at 400° C. for two hours, the Ta resistance is not reduced. However, when X=18 atomic %, annealing process reduces the resistance. When x is higher than 18 atomic %, the low resistance state of Ta is produced during deposition. The resistance of the Cu layer was reduced by annealing at up to x=50 atomic %, above which, an increase was observed. Data in FIGS. 1A and 1B further indicate that an optimal range for Ti is between about 30 atomic % and about 50 atomic %.

Figure 2:
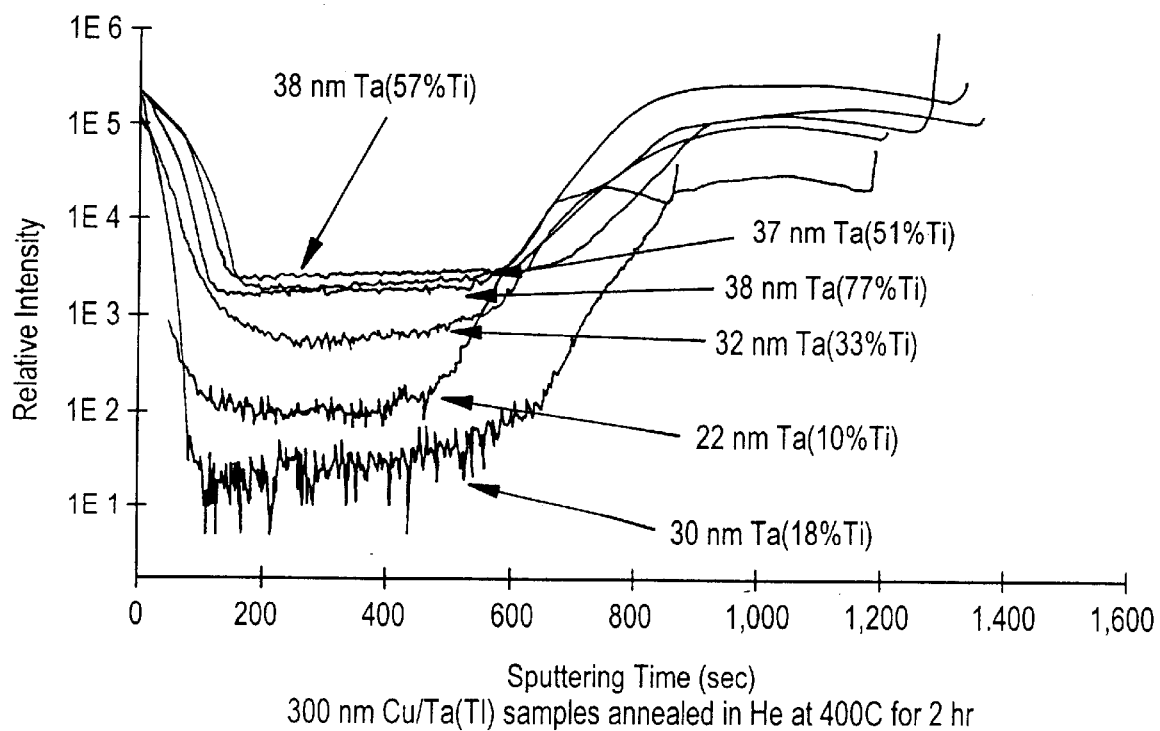
FIG. 2 is a graph illustrating a concentration profile of Ti through the thickness of a Cu layer after annealing showing the solubility of Ti in Cu.

A SIMS analysis of Ti diffusion into Cu is shown in FIG. 2. The Ti profile through the thickness of a Cu layer on annealing indicates that the solubility level of Ti in the Cu reached equilibrium values at above x=50 atomic % with a high segregation to the outer surface. At below x=50 atomic %, the Ti level is below equilibrium with decreasing surface segregation. X-ray diffraction analysis indicates that Ti stabilizes the low temperature phase of Ta, i.e. the bcc alpha phase, and furthermore, at above x=50 atomic %, phase separation of bcc Ti begins to occur. The data is thus consistent with the increased interaction with Cu as previously observed.

Figure 3A:
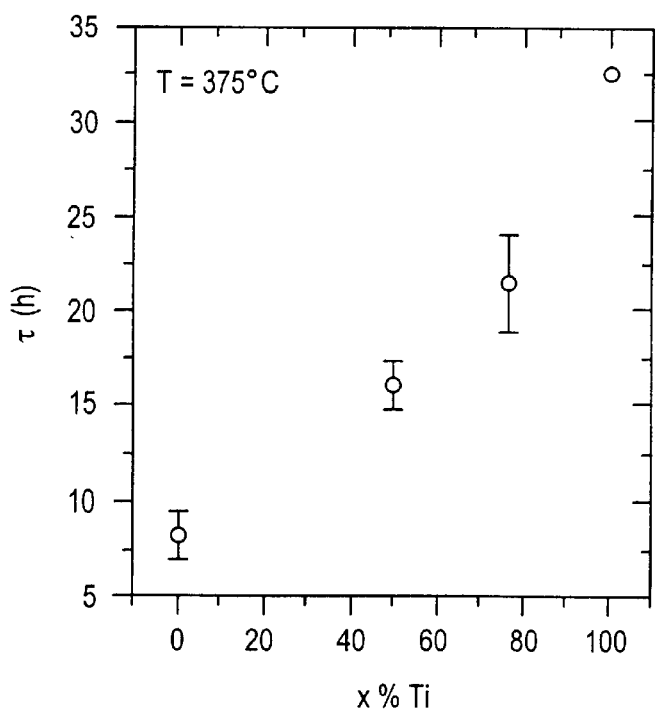
FIG. 3A is a graph illustrating data on changes in electromigration lifetime of Cu in a Cu conductor with a $Ta_{1-x}Ti_x$ liner on one surface while three other surfaces of the Cu conductor are uncovered.
Figure 3B:
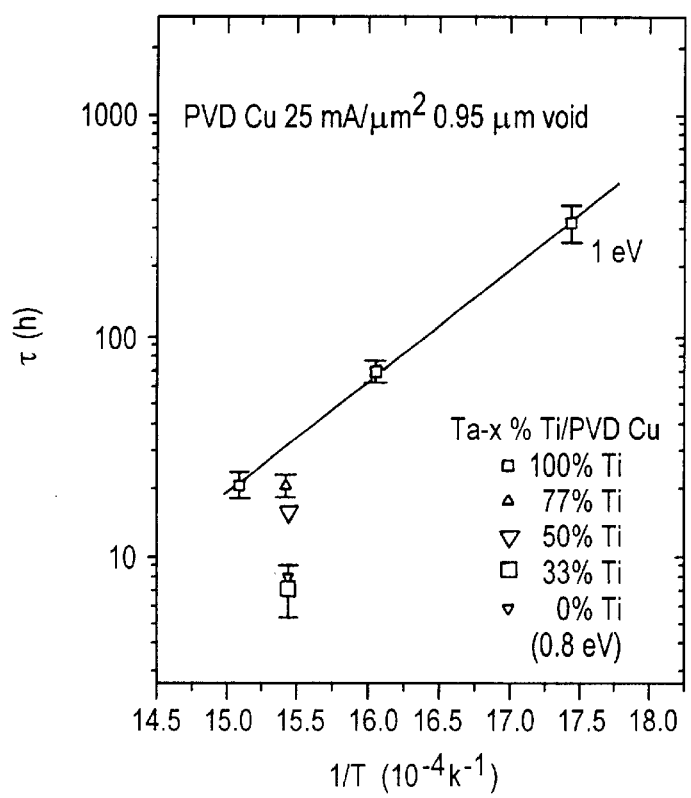
FIG. 3B is a graph of data obtained in a similar manner to those shown in FIG. 3A wherein $Ta_{1-x}Ti_x$ alloy liner is substituted for Ta.

Further shown in FIG. 3A is data obtained on changes in electromigration lifetime of Cu with a $Ta_{1-x}Ti_x$ liner on one surface, while the other three surfaces of the Cu line remain uncoated. The data was taken at 375° C. and 25 ma/$\mu m^2$ with 1 $\mu m$ wide PVD Cu (i.e. evaporated Cu) lines. At such temperature, the lifetime changes by about 5x for x=100 atomic % and decreases to about 2.5x when the concentration of Ti reduces to about x=50 atomic %. However, because of higher activation energy measured for PVD Cu when the TaTi alloy liner is substituted for Ta, improvement at use temperature of 100° C. ($1/T=26.8\times10^{-4}$), as shown in FIG. 3B, would be several orders of magnitude higher.

The total availability of Ti dopant for the Cu lines is key to the effectiveness of the present invention liner, such that coating of all surfaces with the liner is preferred. In the particular embodiment of fabrication methods, this may not be feasible. However, unlined surfaces can be coated by the diffusion of available Ti from the liner through the Cu to the unlined surfaces, as previously shown in FIG. 2. It is therefore suggested that coating three surfaces, as indicated in one embodiment later described, produces higher effectiveness than results shown in FIGS. 3A and 3B.

Figure 4:
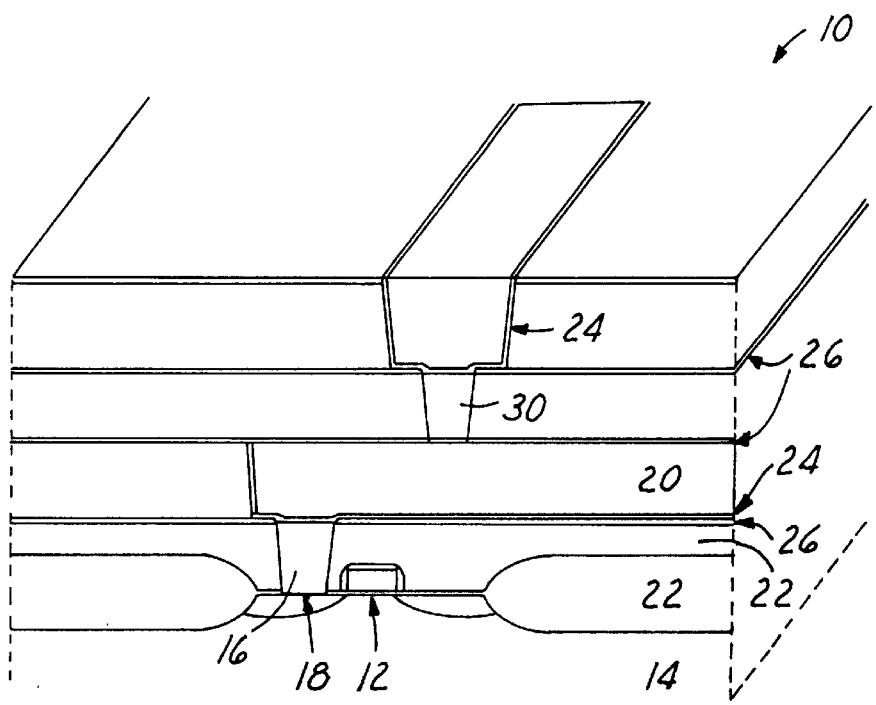
FIG. 4 is an enlarged perspective view of a multi-level Cu interconnect structure incorporating the present invention liner structure.
Figure 5A:
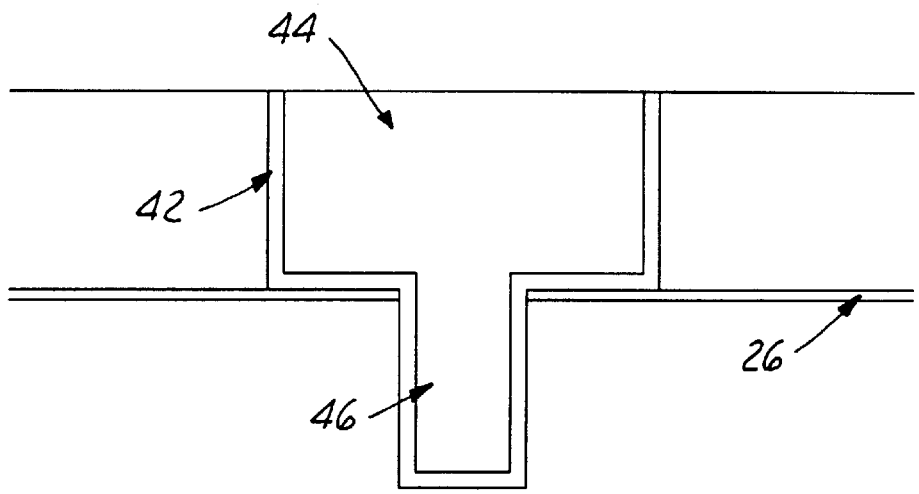
FIG. 5A is an enlarged cross-sectional view of a dual damascene structure incorporating the present invention liner.
Figure 5B:
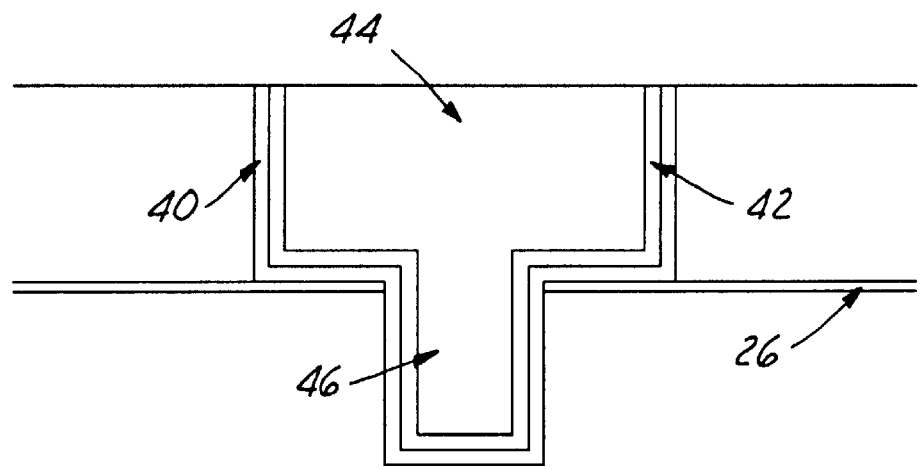
FIG. 5B is an enlarged cross-sectional view of a dual damascene structure incorporating the present invention liner in a bi-layer configuration.

The implementation of the present invention novel method in liners in various embodiments are illustrated in FIGS. 4, 5A and 5B, which illustrate typical structures fabricated in the Cu/liner/dielectric metallization system.

FIG. 4 illustrates an overall diagram of a multi-level Cu interconnection structure 10 into which the present invention novel liner is integrated. The metalization connects to the device 12 formed in substrate 14 through the contact via 16 and the contact 18. Via 16 is usually formed of tungsten, however, it can also be formed of Cu or of Cu alloy. The first level metal 20 is processed into the interlayer dielectic (ILD) 22 usually by a chemical mechanical polishing (CMP) method. A single damascene structure is shown in FIG. 4 in which a trench or via 16 is etched into the ILD layer 22, a liner layer 24 is deposited, followed by the deposition of a Cu layer which is thicker than the ILD layer and then, the Cu layer is polished back by the CMP method until the polish-stop layer 26 is reached. An ILD layer is subsequently deposited, a pattern etched and the previous process repeated for the next level of Cu, i.e. for via 30.

The polish-stop layer 26 is usually formed of silicon nitride, but could be formed by any other low dielectric constant material. Layer 22 can be formed of any ILD dielectric material of either inorganic base or organic base. The present invention specifically concerns with the liner layer 24 and the material used to form the liner layer such as $Ta_{1-x}Ti_x$ bi-layer of $Ta_{1-x}Ti_x/Ta_{1-x-y}Ti_x N_y$, or any other substitutes for Ti such as Zr or Hf, The composition, x can be suitably selected between about 10 and about 60 atomic %.

A dual damascene construction incorporating the present invention liner is shown in FIG. 5B. The configuration is applicable to any Cu metalization process that utilizes a liner material. As shown in FIG. 5B, two levels of patterns are etched into ILD and the Cu deposit fills both during the same deposition, an in a typical dual damascene process. The liner consists of two layers, 40 and 42. The first liner layer 40 abutting the ILD is a layer of $T_{1-x-y}Ti_x N_y$. On top of the first liner layer 40, is deposited liner layer 42 of a $Ta_{1-x}Ti_x$ material, and then followed by the deposition of Cu 44 and 46. The Cu deposition can be carried out by a phydical vapor deposition (PVD) or a chemical vapor deposition (CVD) method, by electroplating, or by layering of PVD (or CVD)/ electroplated Cu in which the PVD or CVD layers are used as seed layers for the plated Cu.

In a second embodiment, as shown in FIG. 5A, a single $Ta_{1-x}Ti_x$ layer 42 is incorporated as the liner layer. The embodiment is preferred as feature size is decreased to the level where liner thickness becomes limiting for resistance control, for Cu deposition and reliability.

In the two embodiments shown above, Ti is transported from the liner 42 through the Cu 44 or along the liner/Cu interface to the uncoated surface of Cu 44 or 46. The transport through the Cu takes place along grain boundaries as well as through the grains and thus, in polycrystalline Cu. Electromigration lifetime is increased by decreasing grain boundary transport as well as by decreasing surface transport. It should be note that not only the electromigration lifetime is increased, the rate at which thermal voids are formed is also reduced as the transport rate is reduced.

When the metal layers 44,46 are formed of Al or Al alloys, the embodiments shown in FIGS. 5A and 5B produced longer lifetime and lower resistance with the $Ta_{1-x}Ti_x$ liners. In such cases, the control of the magnitude of concentration (x) restricts the amount of reaction that forms $TiAL_3$, and thereby producing a thinner, more planar inter-metallic layer. This results in decreased current density and resistance of the Al lines, as well as closer tolerances and geometry and lifetime distribution.

The present invention novel conductor and the liner for lining the conductor have therefore been amply described in the above description and in the appended drawings of FIGS. 1~5B.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A conductor in an electronic structure comprising:
    a conductor body formed of an alloy comprises between about 0.001 atomic % and about 2 atomic % of an element selected from the group consisting of Ti, Zr, In, Sn and Hf, and
    a liner abutting said conductor body formed of an alloy comprises between about 10 atomic % and 50 atomic % of at least one element selected from the group consisting of Ta, W, Ti, Nb, N and V.

2. A conductor in an electronic structure according to claim 1, wherein said conductor body further comprises Cu or Al.

3. A conductor in an electronic structure according to claim 1, wherein said conductor body comprises Al and Ti, and said liner comprises between about 10 atomic % and about 90 atomic % Ta.

4. A conductor in an electronic structure according to claim 1, wherein said conductor body comprises Al and Ti, said liner comprises between about 10 atomic % and about 90 atomic % Ti.

5. A conductor in an electronic structure according to claim 1, wherein said conductor body comprises between about 0.001 atomic % and about 2 atomic % of Ti, said liner comprises not less than 10 atomic % Ti.

6. A liner for a semiconductor interconnect formed of a material selected from the group consisting of Ti, Hf, In, Sn, Zr and alloys of $TiCu_3$, $Ta_{1-x}Ti_x$, $Ta_{1-x}Hf_x$, $T_{1-x}In_x$, $Ta_{1-x}Sn_x$, $Ta_{1-x}Zr_x$ each having between 18 atomic % and 50 atomic % of one element of Ti, Hf, In, Sn or Zr and mixtures thereof.

7. A liner for a semiconductor interconnect according to claim 6, wherein said material is $Ta_{1-x}Ti_x$.

8. A liner for a semiconductor interconnect according to claim 7, wherein X=10~60 atomic % when said liner abuts a semiconductor interconnect formed of Cu or Cu alloy.

9. A liner for a semiconductor interconnect according to claim 7, wherein X=10~90 atomic % when said liner abuts a semiconductor interconnect formed of Al or Al alloy.

10. A method for forming an electronic structure comprising the steps of:
    forming an opening in a pre-processed electronic substrate;
    depositing into said opening a liner of a material selected from the group consisting of Ti, Hf, In, Sn, Zr and alloys of $TiCu_3$, $Ta_{1-x}Ti_x$, $Ta_{1-x}Hf_x$, $Ta_{1-x}In_x$, $Ta_{1-x}Sn_x$, $Ta_{1-x}Zr_x$ each having between 18 atomic % and 50 atomic % of one element of Ti, Hf, In, Sn or Zr and mixtures thereof.

11. A method for forming an electronic structure according to claim 10 further comprising the step of filling said opening with a Cu alloy or an Al alloy.

12. A method for forming an electronic structure according to claim 10 further comprising a step of filling said opening with said alloy by a method selected from the group consisting of PVD, CVD, electrodeposition and electroless deposition.

13. A method for forming an electronic structure according to claim 10 further comprising the step of depositing a liner of $Ta_{1-x}Ti_x$ and annealing said liner at a temperature not higher than 450° C. when said x is larger than about 20 atomic %.

* * * * *